(12) United States Patent
Fukase et al.

(10) Patent No.: US 6,528,236 B1
(45) Date of Patent: Mar. 4, 2003

(54) PHOTOSENSITIVE RESIN COMPOSITION, MULTILAYER PRINTED WIRING BOARD AND PROCESS FOR PRODUCTION THEREOF

(75) Inventors: Toshimitsu Fukase, Tokyo (JP); Koji Amano, Tokyo (JP); Makoto Fujiwara, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 119 days.

(21) Appl. No.: 09/665,106

(22) Filed: Sep. 20, 2000

(30) Foreign Application Priority Data

| Sep. 24, 1999 | (JP) | ............................................. 11-271393 |
| Jan. 21, 2000 | (JP) | ........................................ 2000-013553 |
| Feb. 24, 2000 | (JP) | ........................................ 2000-047383 |
| Mar. 29, 2000 | (JP) | ........................................ 2000-092261 |

(51) Int. Cl.$^7$ ........................ G03F 7/027; G03F 7/038; C09J 133/00; H05K 3/46

(52) U.S. Cl. .............................. 430/280.1; 430/283.1; 430/285.1; 430/906; 522/137; 522/138; 522/167

(58) Field of Search ........................... 430/283.1, 280.1, 430/285.1, 906; 522/137, 138, 168

(56) References Cited

U.S. PATENT DOCUMENTS

| 3,622,321 A | | 11/1971 | Smets et al. .............. 96/115 R |
| 4,079,041 A | * | 3/1978 | Baumann et al. ...... 260/63 UY |
| 4,416,975 A | * | 11/1983 | Green et al. ................. 430/327 |
| 5,451,721 A | | 9/1995 | Tsukuda et al. ............ 174/261 |

FOREIGN PATENT DOCUMENTS

| EP | 0 304 174 A2 | 2/1989 |
| JP | 4-148590 | 5/1992 |
| JP | 7-49464 | 5/1995 |
| JP | 8-81670 | 3/1996 |

OTHER PUBLICATIONS

Grant et al, eds, Grant and Hackh's Chemical Dictionary, Fifth Edition, McGraw–Hill Book Company, New York, N.Y., 1987, pag 519.*
Morrison, et al, Organic Chemistry, Allyn and Bacon, Inc, Boston, Mass, 1973, pp. 318–330.*
Citraconic Anhydride and Citraconic Acid, from Internet, Web page, www.orgsys.org/orgsyn/orgysyn/prepContnet.asp?rxntypeid=127&prep+CV2P, from Organic Syntheses, CV 2, 140, two pages printed on Aug. 19, 2002.*
♦Patent Abstracts of Japan, vol. 013, No. 187 (C–592), May 2, 1989 & JP 01 014233 A.
Database WPI, Section Ch, Week 199931, Derwent Publications Ltd., London, GB; Class A89, AN 1999–361538 XP002154984 & JP 11 133605 A.
Patent Abstracts of Japan, vol. 1999, No. 03, Mar. 31, 1999 & JP 10 333325 A.
European Search Report issued for EP 00 12 0472 dated Dec. 28, 2000.

* cited by examiner

*Primary Examiner*—Cynthia Hamilton
(74) *Attorney, Agent, or Firm*—Smith, Gambrell & Russell, LLP

(57) ABSTRACT

The invention provides an photosensitive resin composition excellent in heat resistance and adhesion to wiring layers which yields high resolution after development with aqueous solution containing no organic solvent. The composition is used as an adhesive between circuits in a process producing a multi-layer printed wiring board by a built-up method. The composition comprises a compound (A) having the molecule at least one phenolic hydroxyl group and at least one acryloyl or methacryloyl group, an unsaturated imide compound (B), a photopolymerization initiator (c) and, optionally, an epoxy compound (D) having at least two epoxy groups in the molecule. Also, provided for is a multilayer printed wiring board comprising wiring layers and insulating layers, which are alternatively formed wherein said insulating layers are formed of said composition.

4 Claims, No Drawings

PHOTOSENSITIVE RESIN COMPOSITION, MULTILAYER PRINTED WIRING BOARD AND PROCESS FOR PRODUCTION THEREOF

BACKGROUND OF THE INVENTION

The present invention relates to a photosensitive resin composition having both ultraviolet-setting property and thermosetting property. More particularly, the present invention relates to a photosensitive resin composition that can be utilized in various fields such as the fields of coating materials, printing industry and electronics industry as an ultraviolet-setting coating material, a plate-making material or the like and is used as, in particular, an adhesive between circuit layers in, for example, printed wiring boards for livelihood and printed wiring boards for industry. In addition, the present invention relates to a multilayer printed wiring board comprising insulating layers of said photosensitive resin composition used as an adhesive between circuit layers, and a process for producing the multilayer printed wiring board.

In recent years, so-called "improvements for high-density packaging" involving the formation of a fine pattern and multiple layers of wiring have proceeded in printed wiring boards, with a reduction in size and an improvement in performance characteristics of electronic machines. As high-density printed wiring boards such as those for mounting semiconductor chips, multilayer printed wiring boards have been widely used which are produced by a build-up method comprising laminating insulating layers and wiring layers alternately on a substrate.

The insulating layers of the multilayer printed wiring board produced by the conventional build-up method are formed not by impregnating a core material such as glass cloth with an insulating material, but by applying a photosensitive resin composition on a substrate without a core material and light-curing and heat-curing the composition. Properties required of the photosensitive resin composition in this production process are, for example, as follows: the composition can form a uniform coating film having no void, on an internal circuit layer having a certain degree of unevenness; the composition is photosensitive and developable and has a sufficient resolution to form desirable via holes; the composition is resistant to chemicals such as a plating solution and a surface-treating agent; and the composition is flexible for preventing the formation of cracks by application of force in a production and construction process using a thin substrate obtained by coating a substrate.

The printed wiring board produced is required to have electrical insulating properties and heat resistance for soldering in mounting of parts. When a semiconductor is directly mounted, the printed wiring board is required to have, for example, resistance to wire bonding and resistance to heat cycle. For attaining these heat resistances, it is necessary to use a photosensitive resin composition having a high glass transition temperature. However, there is no photosensitive resin composition having the various properties described above.

At present, so-called photo-solder resists are known as photosensitive insulating materials and are often used as an adhesive between circuit layers. For example, JP-A-4(1992)-148590 discloses a multilayer wiring board obtained by forming photo-via holes by using a photosensitive epoxy resin. In addition, there is, for example, a composition comprising a phenolic resin having acryloyl groups or methacryloyl groups, a polyfunctional epoxy compound and a photopolymerization initiator (JP-B-7(1995)-49464). However, when such a photosensitive epoxy resin is used as a main constituent, the resulting composition is disadvantageous in that it has a low glass transition temperature, resulting in many limitations on a method for mounting of parts.

In general, properties such as dynamic visco-elastic modulus, thermal expansion coefficient and dielectric constant of the insulating layer of a printed wiring board markedly change at the glass transition point of the insulating layer. Therefore, when the insulating layer is heated to a temperature higher than the glass transition point, there is a fear that ply separation may be caused between a substrate and the insulating layer or between the insulating layer and a wiring layer. There is also a fear of marked change in the electric characteristics of the insulating layer.

When a part to be mounted such as a semiconductor chip is mounted on a multilayer printed wiring board produced by the build-up method, the glass transition temperature should be about 150° C. or higher in order that the printed wiring board can withstand thermal stress in a heating step.

However, a printed wiring board produced by the build-up method by the use of a conventional photosensitive resin composition is disadvantageous in that it does not satisfy the above requirement because the glass transition temperature of its insulating layer is about 130° C.

An electroconductive layer on the inner surface of each via hole formed in either a wiring layer on the insulating layer of a printed wiring board produced by the build-up method or the insulating layer is formed by a plating method. The peel strength of a plating layer on the insulating layer should be 800 N/m or more in practice in order that the plating layer may not peel off owing to heat history.

Conventional printed wiring boards, however, are disadvantageous in that they do not satisfy the above requirement because the peel strength of a plating layer on the insulating layer of the printed wiring board is about 600 N/m.

SUMMARY OF THE INVENTION

The present invention has been accomplished as a result of earnest investigation carried out in view of the problems described above. An object of the present invention is to provide a photosensitive resin composition for an adhesive between circuit layers which can be developed with an aqueous developing solution containing no organic solvent, has various characteristics required of a internal-layer material for a multilayer wiring board, such as a high adhesion to a substrate, i.e., a high peel strength for a wiring layer, and has an especially excellent heat resistance, and to provide a highly reliable printed wiring board obtained by using said resin composition and a process for producing the printed wiring board.

The present inventors found that a photosensitive resin composition comprising an unsaturated imide compound as an essential constituent has a high glass transition temperature by virtue of the rigid structure of the unsaturated imide compound.

The present inventors also found the following. Particularly when the unsaturated imide compound is a bismaleimide type compound, it does not produce a substituent that is subject to oxidative cleavage, even when it is reacted with a phenolic hydroxyl group. Therefore, an epoxy compound capable of producing a hydroxyethylene group by reaction with a phenolic hydroxyl group is used together with the unsaturated imide compound to facilitate oxidative cleavage. Thus, when a wiring layer is formed on a resin layer, fine anchors are formed in the resin layer, resulting in a high peel strength between the resin layer and the wiring layer.

The present inventors also found the following. When the unsaturated imide compound contains a maleimide type addition compound, the presence of functional groups such as carboxyl group, unsaturated imide group and amide group in the maleimide type addition compound is advantageous in that the photosensitive resin composition has, of course, a high glass transition temperature, is soluble in an alkaline aqueous solution, and has an excellent resolution. In addition, the photosensitive resin composition can be expected to have a high adhesion to a substrate. Furthermore, treatment of the photosensitive resin composition with a permanganate or the like before plating exposes the functional groups good in plate adhesion, resulting in strong binding to a plating layer, and hence a high peel strength can be attained between the photosensitive resin composition and a wiring layer. The present invention has been accomplished on the basis of the above findings.

That is, the present invention provides a photosensitive resin composition comprising a compound (A) having in the molecule at least one phenolic hydroxyl group and at least one acryloyl or methacryloyl group, an unsaturated imide compound (B) and a photopolymerization initiator (C) as essential constituents, and optionally an epoxy compound (D) having at least two epoxy groups in the molecule;

the above-mentioned photosensitive resin composition wherein the aforesaid unsaturated imide compound (B) is a bismaleimide type compound or contains a maleimide type addition compound comprising structures represented by the general formulas (1) and/or (2); and a multilayer printed wiring board comprising wiring layers and insulating layers, which are alternately formed, said insulating layers being formed of the above-mentioned photosensitive resin composition;

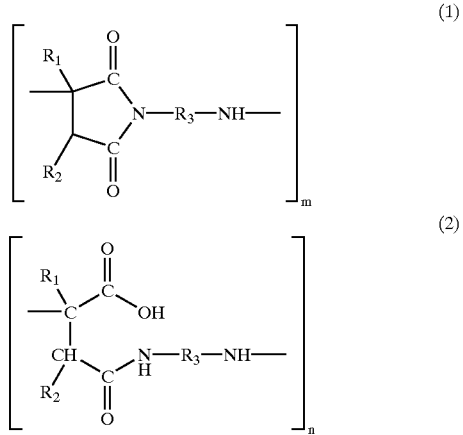

wherein each of $R_1$ and $R_2$ is a hydrogen atom, an alkyl group, a phenyl group or a substituted phenyl group, $R_3$ is an aliphatic group of two or more carbon atoms, a cyclic aliphatic group, or a divalent aromatic group selected from the group consisting of monocyclic aromatic groups, fused polycyclic aromatic groups and non-fused polycyclic aromatic groups composed of aromatic groups connected to each other directly or through a crosslinker, and each of m and n is an integer of 1 or more, the structures of the formulas (1) and (2) being able to be arranged either regularly or irregularly.

In addition, the present invention provides a process for producing a multilayer printed wiring board using the above-mentioned photosensitive resin composition as an adhesive between circuit layers, which comprises the following steps carried out in the order in which they are described:

(1) a step of forming an adhesive layer by applying the aforesaid adhesive on the circuit formation surface of a printed circuit board having one or more circuit layers previously formed thereon, and heating and drying the adhesive, or by pressure-bonding a dry film of the aforesaid adhesive to the circuit formation surface, (2) a step of curing the adhesive layer by setting a photomask having a via hole pattern formed thereon, on the adhesive layer, followed by light irradiation, (3) a step of removing the photomask, (4) a step of forming via holes by developing the non-irradiated portion of the adhesive layer with an alkaline aqueous solution, (5) a step of curing the thus treated adhesive layer by heating, and (6) a step of forming a conductor layer on the adhesive layer surface and in via hole portions by panel plating or pattern plating.

DETAILED DESCRIPTION OF THE INVENTION

As the compound (A) having in the molecule at least one phenolic hydroxyl group and at least one acryloyl or methacryloyl group which is used in the present invention, there are compounds obtained by reacting a compound having one or more phenolic hydroxyl groups, such as phenol, cresol or bisphenol A with an aldehyde such as formaldehyde to obtain a novolak resin, and reacting the novolak resin with glycidyl acrylate or glycidyl methacrylate in the presence of a base catalyst such as triethylamine (the ratio of phenolic hydroxyl group(s) to acryloyl or methacryloyl group(s) in the molecule is not particularly limited), for example, methacrylic acid-modified bisphenol A novolaks. The compound (A) is not limited to these compounds.

As the unsaturated imide compound (B) used in the present invention, there are exemplified bismaleimides such as N,N'-(4,4'-diphenylmethane)bismaleimide, N,N'-(2,2'-diethyl-6,6'-dimethyl-4,4,-methylenediphenylene)-bismaleimide and 2,2'-bis[4-(4-maleimidophenoxy)phenyl]-propane, and compounds obtained by reacting a compound having a plurality of amino groups with maleic anhydride or citraconic anhydride. Alternatively, compositions containing a maleimide type addition compound comprising structures represented by. the general formulas (1) and/or (2) (hereinafter referred to as "maleimide type addition compound") are preferable.

The aforesaid maleimide type addition compound used in the present invention is obtained by mixing monomers of a maleic acid of the general formula (3) and an aromatic diamine in a molar ratio of 3:1 to 1:1. As a process for producing the maleimide type addition compound, there is a process of mixing the above-mentioned monomers each in a powder solid state and heat-treating the resulting mixture at 80 to 200° C. to obtain a maleimide type addition compound comprising structures in which an unsaturated imide group and an amide group coexist. When the heat treatment is carried out at a high temperature above 200° C., the reaction proceeds rapidly but remarkable partial gelation is caused by a side reaction, so that the resulting compound contains a solvent-insoluble portion. When the heating temperature is lower than 80° C., the reaction rate decreases rapidly and unreacted materials remain, so that no resin having a high molecular weight can be obtained.

There is also a process for producing the same maleimide type addition compound as above which comprises dissolving each of the monomers in an organic solvent, mixing the resulting solutions so that the monomers may be mixed in the above-mentioned molar ratio, stirring and mixing the solutions at room temperature for 10 to 24 hours, separating the reaction product from the organic solvent, and heat-treating the separated reaction product if necessary. When the stirring and mixing time is less than 10 hours, the reaction time is short and hence unreacted materials remain, so that no resin having a high molecular weight can be obtained. When the stirring and mixing time is more than 24 hours, the amount of the desired reaction product has reached a point of saturation, resulting in a low productivity.

In the present invention, maleimide type addition compounds obtained by any of the above processes may be used singly or in combination.

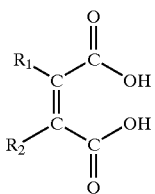

(3)

wherein each of $R_1$ and $R_2$ is a hydrogen atom, an alkyl group, a phenyl group or a substituted phenyl group.

As to the molar ratio of the maleic acid to the aromatic diamine, when the proportion of the maleic acid is so high that the molar ratio is more than 3, the excess maleic acid remained unreacted to deteriorate the reliability on insulation of a printed wiring board. When the proportion of the maleic acid is so low that the molar ratio is less than 1, the aromatic diamine remains to deteriorate the transmittance for ultraviolet light, resulting in a low resolution.

As t he maleic acid used in the present invention, maleic acid and citraconic acid can be exemplified. of these, maleic acid is especially preferable. The reason is that maleic acid has a high reactivity either at the time of reaction with heating or in a solution and is inexpensive. As the maleic acid, either a single maleic acid or a combination of two or more maleic acids may be used.

The aromatic diamine used in the present invention includes 3,3'-dimethyl-4,4'-diaminobiphenyl, 4,6-dimethyl-m-phenylenediamine, 2,5-dimethyl-p-phenylenediamine, 2,4-diaminomesitylene, 4,4'-methylene-di-o-toluidine, 4,4'-methylenediamine-2,6-xylylene, 4,4'-methylene-2,6-diethylaniline, 2,4-toluenediamine, m-phenylenediamine, p-phenylenediamine, 4,4'-diamino-diphenylpropane, 3,3'-diaminodiphenylpropane, 4,4'-diaminodiphenylethane, 3,3'-diaminodiphenylethane, 4,4'-diaminodiphenylmethane, 3,3,-diaminodiphenylmethane, 4,4'-diaminodiphenyl sulfide, 3,3'-diaminodiphenyl sulfide, 4,4'-diaminodiphenylsulfone, 3,3'-diaminodiphenylsulfone, 4,4'-diaminodiphenyl ether, 3,3'-diaminodiphenyl ether, benzidine, 3,3'-diaminobiphenyl, 3,3'-dimethyl-4,4'-diaminobiphenyl, 3,3'-dimethoxybenzidine, bis(p-aminocyclo-hexyl)methane, bis(p-β-amino-t-butylphenyl) ether, bis(p-β-methyl-δ-aminopentyl)benzene, p-bis(2-methyl-4-amino-pentyl)benzene, 1,5-diaminonaphthalene, 2,6-diaminonaphthalene, 2,4-bis(δ-amino-t-butyl)toluene, 2,4-diaminotoluene, m-xylene-2,5-diamine, p-xylylene-2,5-diamine, m-xylylenediamine, p-xylylenediamine, 2,6-diaminopyridine, 2,5-diamino-1,3,4-oxadiazole, 1,4-diaminocyclohexane, piperazine, methylenediamine, ethylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4'-dimethylheptamethylenediamine, octamethylenediamine, nonamethylenediamine, 5-methylnonamethylenediamine, decamethylenediamine, 1,3-bis(3-aminophenoxy)-benzene, 2,2'-bis[4-(4-aminophenoxy)phenyl]propane, 1,3-bis(4-aminophenoxy) benzene, bis-4-(4-aminophenoxy)phenylsulfone, bis-4-(3-aminophenoxy)phenylsulfone, etc. Of these, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl ether and 3,3'-diaminodiphenyl ether are preferable. Of these, 4,4'-diaminodiphenylmethane is more preferable from the viewpoint of reactivity and cost. The diamines exemplified above may be used singly or in combination.

The photopolymerization initiator (C) used in the present invention includes, for example, benzoin; benzoin alkyl ethers such as benzoin methyl ether, benzoin isopropyl ether, etc.; acetophenones such as acetophenone, 2,2-dimethoxy-2-acetophenone, 2,2-dimethoxy-2-phenyl-acetophenone, 1,1-dichloroacetophenone, etc.; anthraquinones such as 2-methylanthraquinone, 2-tert-butylanthraquinone, 1-chloroanthraquinone, 2-amyl-anthraquinone, etc.; thioxanthones such as 2,4-dimethylthioxanthone, 1-chlorothioxanthone, 2,4-diisopropylthioxanthone, etc.; ketals such as acetophenone dimethyl ketal, benzyl dimethyl ketal, etc.; benzophenones such as benzophenone, etc.; and xanthones. In addition, such a photopolymerization initiator (C) can be used in combination with one or more photopolymerization promoters selected from conventional photopolymerization promoters of benzoic acid type, tertiary amine type or the like, according to a conventional method.

The epoxy compound (D) having at least two epoxy groups in the molecule includes phenolic novolak type epoxy resins, cresol novolak type epoxy resins, bisphenol A-based epoxy resins, bisphenol F-based epoxy resins, bisphenol S-based epoxy resins, bisphenol-based epoxy resins, N-glycidyl ether epoxy resins, alicyclic epoxy resins, etc. The epoxy compound (D) is not limited to them.

Besides the main constituents, the constituents described below may be incorporated into the photosensitive resin composition of the present invention if necessary. The incorporation can improve not only the handleability and curing property of said resin composition but also characteristics of a cured product.

A photopolymerizable vinyl compound (E) containing at least one acryloyl or methacryloyl group in the molecule may be incorporated as a first optional constituent. The photopolymerizable vinyl compound (E) includes, for example, acrylates such as β-hydroxyethyl acrylate, β-hydroxypropyl acrylate, glycidyl acrylate, β-hydroxyethylacryloyl phosphate, dimethylaminoethyl acrylate, diethylaminoethyl acrylate, ethylene glycol diacrylate, diethylene glycol diacrylate, polyethylene glycol diacrylates, propylene glycol diacrylate, dipropylene glycol diacrylate, polypropylene glycol diacrylates, trimethylolpropane diacrylate, trimethylolpropane triacrylate, pentaerythritol triacrylate, pentaerythritol tetraacrylate, dipentaerythritol tetraacrylate, dipentaerythritol pentaacrylate, tris(2-acryloyloxyethyl) isocyanurate, etc.; methacrylates obtained by replacing the acryloyl group(s) of each of these acrylates with methacryloyl group(s); monoesters, diesters, triesters and higher-order polyesters, which are obtained by esterification reaction of a polybasic acid with a hydroxyalkyl (meth)acrylate; bisphenol A epoxyacrylate; novolak type epoxyacrylates; and urethane acrylate. Polyfunctional monomers, oligomers or prepolymers having two or more acryloyl or methacryloyl groups in the molecule are preferably used as the photopolymerizable vinyl compound (E).

Of the photopolymerizable vinyl compounds (E) exemplified above, for example, those having a low viscosity function also as a so-called reactive diluent and make it possible to adjust the viscosity of the photosensitive resin composition of the present invention without deteriorating the curing property of the composition. The incorporation of a polyfunctional photopolymerizable vinyl compound (E) can increase the crosslinking density of the resulting cured product. In addition, for example, the ultraviolet-setting property and developability of the photosensitive resin composition or the adhesion of a cured product to a substrate can be effectively improved by varying the amount of the photopolymerizable vinyl compound (E) incorporated.

An organic solvent (F) may be incorporated as a second optional constituent. The organic solvent (F) includes, for example, ketones such as methyl ethyl ketone, cyclohexanone, etc.; ethers such as diethyl ether, tetrahydrofuran, 1,4-dioxane, etc.; Cellosolves such as methyl Cellosolve, ethyl Cellosolve, etc.; esters such as ethyl acetate, Cellosolve acetates, etc.; nitriles such as acrylonitrile, etc.; formamides such as N,N-dimethylformamide, etc.; and pyrrolidones such as N-methyl-2-pyrrolidone, etc. Organic solvents having a certain degree of polarity, such as the ketones and the formamides are preferable.

The organic solvents (F) exemplified above make it possible to adjust the viscosity of the photosensitive resin composition to a viscosity suitable for applying the composition, and to improve the handleability of the resin composition effectively.

A curing accelerator (G) for the unsaturated imide compound (B) may be incorporated. The incorporation accelerates the reaction of the phenolic hydroxyl group(s) of the compound (A) with the unsaturated imide groups of the compound (B) to improve the curing property of the composition. The curing accelerator (G) includes, for example, imidazoles such as imidazole, 2-ethylimidazole, 2-ethyl-4-methylimidazole, etc.; and tertiary amines such as triethylamines, N,N-dimethylbenzylamine, 2,4,6-tris(N,N-dimethylaminomethyl)phenol, etc.

A photosensitizer (H) may be incorporated as a third optional constituent. The photosensitizer (H) includes, for example, amines such as dimethylaminoethyl methacrylate, n-butylamine, triethylamine, isoamyl 4-dimethylaminobenzoate, etc.

These photosensitizers (H) can effectively improve, for example, the ultraviolet-setting property and developability of the photosensitive resin composition.

In addition to the above constituents, conventional additives may be added to the photosensitive resin composition of the present invention if necessary. The additives include, for example, inorganic fillers such as barium sulfate, barium titanate, silicon dioxide, amorphous silica, zirconium silicate, talc, clay, magnesium carbonate, calcium carbonate, aluminum oxide, aluminum hydroxide, mica, etc.; coloring agents such as Phthalocyanine Blue, Phthalocyanine Green, Iodine Green, Disazo Yellow, Crystal Violet, titanium oxide, carbon black, naphthalene black, etc.; polymerization inhibitors such as hydroquinone, hydroquinone monomethyl ether, phenothiazine, etc.; thickening agents such as Orbene, Bentone, etc.; silicone-based, fluorine-containing or polymer-based defoaming agents and leveling agents; and adhesive-properties-imparting agents such as imidazole type ones, thiazole type ones, triazole type ones, silane coupling agents, etc.

The proportions of the constituents of the photosensitive resin composition of the present invention are explained below. The proportion of the bismaleimide type compound as the unsaturated imide compound (B) is 10 to 900 parts by weight (hereinafter referred to as parts), preferably 30 to 300 parts, per 100 parts of the compound (A) having in the molecule at least one phenolic hydroxyl group and at least one acryloyl or methacryloyl group. When the proportion is less than 10 parts, properties such as heat resistance and moisture resistance of a cured product are not improved in some cases. When the bismaleimide type compound is incorporated in a proportion of more than 900 parts, the ultraviolet-setting property and the like are deteriorated.

The proportion of the maleimide type addition compound comprising structures of the general formulas (1) and (2) is 10 to 300 parts, preferably 30 to 150 parts, per 100 parts of the compound (A) having in the molecule at least one phenolic hydroxyl group and at least one acryloyl or methacryloyl group. When the proportion is less than 10 parts, properties such as heat resistance and toughness of a cured product are not improved in some cases. When the maleimide type addition compound is incorporated in a proportion of more than 300 parts, the ultraviolet-setting property and the like are deteriorated.

The proportion of the photopolymerization initiator (C) is preferably 0.2 to 50 parts, more preferably 2 to 20 parts, per 100 parts of the compound (A). When the photopolymerizable vinyl compound (E) having at least one acryloyl or methacryloyl group in the molecule is used, the proportion of the photopolymerization initiator (C) is preferably 0.2 to 50 parts, more preferably 2 to 20 parts, per 100 parts of the sum of the compound (A) and the compound (E). When the proportion is less than 0.2 part, the ultraviolet-setting property becomes insufficient in some cases. When the photopolymerization initiator (C) is incorporated in a proportion of more than 50 parts, the curing property is not improved any more and moreover, physical properties of a cured product are deteriorated in some cases by remaining unreacted photopolymerization initiator (C).

As to the blending ratio of the unsaturated imide compound (B) to the epoxy compound (D), they are preferably blended so that the ratio of the number of equivalents of the unsaturated imide groups to that of the epoxy groups may be 0.2 to 5, more preferably 0.5 to 3. When the ratio of the number of equivalents of the unsaturated imide groups to that of the epoxy groups is less than 0.2, the glass transition temperature of the resin composition is low. When the ratio is more than 5, the peel strength becomes insufficient.

The proportions of the unsaturated imide compound (B) and the epoxy compound (D) are such that the total amount of the unsaturated imide compound (B) and the epoxy compound (D) is 10 to 900 parts, preferably 30 to 300 parts, per 100 parts of the compound (A) having in the molecule at least one phenolic hydroxyl group and at least one acryloyl or methacryloyl group. When the total amount is less than 10 parts, physical properties such as heat resistance and moisture resistance of a cured product are not improved in some cases. When the compounds (B) and (D) are incorporated in a total amount of more than 900 parts, the ultraviolet-setting property and the like are deteriorated.

When the photopolymerizable vinyl compound (E) is used, its proportion is 0.1 to 500 parts, preferably 3 to 100 parts, per 100 parts of the sum of the compound (A) and the unsaturated imide compound (B). When the proportion is more than 500 parts, the heat resistance, moisture resistance and the like of a cured product are deteriorated in some cases.

When a maleimide type addition compound represented by the general formulas (1) and (2) is used as the unsaturated imide compound (B), the proportion of the vinyl compound (E) is 0.1 to 200 parts, preferably 3 to 100 parts, per 100 parts of the sum of the compound (A) and the maleimide type addition compound. When the proportion is more than 200 parts, the heat resistance, moisture resistance and the like of a cured product are deteriorated in some cases.

When the organic solvent (F) is used, its proportion is 0.1 to 500 parts, preferably 3 to 100 parts, per 100 parts of the sum of the compound (A) and the unsaturated imide compound (B). When a maleimide type addition compound is used as the unsaturated imide compound, the proportion of the organic solvent (F) is 0.1 to 400 parts, preferably 3 to 200 parts, per 100 parts of the sum of the compound (A) and the maleimide type addition compound. In general, the organic solvent (F) is incorporated, for example, for adjusting the viscosity and coating amount (coating thickness) of the composition of the present invention. When the organic solvent (F) is incorporated in a large excess, the viscosity of the composition becomes too low, so that the formation of a uniform coating film becomes difficult, and moreover, energy and time required for drying and removing the solvent are excessively increased.

When the curing accelerator (G) is used, its proportion is 0.1 to 5 parts, preferably 0.1 to 1 part, per 100 parts of the sum of the compound (A) and the unsaturated imide compound (B). When the proportion is too high, the storage stability of the photosensitive resin composition of the present invention is deteriorated.

When the photosensitizer (H) is used, its proportion is 0.1 to 5 parts, preferably 0.1 to 1 part, per 100 parts of the sum of the compound (A) and the unsaturated imide compound (B). When the proportion is too high, the storage stability of the photosensitive resin composition of the present invention is deteriorated.

When the inorganic filler is used, its proportion is preferably 0.1 to 100 parts, more preferably 5 to 60 parts, per 100 parts of the total amount of the photosensitive resin composition of the present invention.

The photosensitive resin composition of the present invention can be obtained by mixing the above components in the same manner as in the case of a well-known photosensitive resin composition, and, if necessary, kneading them by means of a three-roll mill or the like.

The photosensitive resin composition of the present invention has both ultraviolet-setting property and thermosetting property and is provided in various fields. There is explained below a process for producing the multi-layer printed wiring board of the present invention comprising wiring layers and insulating layers, which are alternately formed, wherein said photosensitive resin composition is used as an adhesive between circuit layers to form the insulating layers.

First, the adhesive between circuit layers used in the present invention is applied on a printed circuit board having one or more circuit layers formed thereon. In this case, a metal surface on which the circuits are to be formed may be previously roughened by a suitable method such as oxidizing treatment. The adhesion can be improved by the roughening. As to an applying method, an adhesive layer can be formed by a method comprising applying the adhesive by screen printing or applying the adhesive on the whole surface of the printed circuit board with a curtain coater, spin coater, spray coater or the like, and heating and drying the adhesive in a circulating hot air oven or the like.

When a printed circuit board having a plurality of circuit layers formed thereon is produced, internal circuits are formed on a substrate. As a method for the formation, there can be utilized methods adopted for producing a well-known printed wiring board, such as panel plating process, subtractive process, additive process, etc.

The following method for forming an adhesive layer can also be adopted: the adhesive between circuit layers is applied on a suitable substrate such as a poly(ethylene terephthalate) (PET) film and dried to form so-called a dry film in which the adhesive has attained B-stage, and the dry film is pressure-bonded to the circuits.

Then, a photomask having a via hole pattern formed thereon is set on the adhesive layer formed above, and the adhesive layer is exposed to light by a contact method by selective irradiation with actinic rays from a high-pressure mercury lamp, a metal halide lamp or the like, to be cured. In this case, the adhesive layer may be cured by direct irradiation with laser beams.

Subsequently, the photomask is removed and the unexposed portion of the adhesive layer is developed with a developing solution, whereby photo-via holes can be formed. In the exposure step, the aforesaid adhesive layer may be irradiated with laser beams or exposed to actinic rays, by a non-contact method and in a wet state without drying.

As the developing solution for forming the photo-via holes, there can be used aqueous solutions of alkalis such as sodium hydroxide, potassium hydroxide, sodium carbonate, tetramethylammonium hydroxide, etc. Although organic solvents such as methyl ethyl ketone, methyl Cellosolve, cyclohexanone, etc. can be used, the alkali aqueous solutions are preferably used from the viewpoint of work environment.

After forming the pattern, the adhesive layer is cured by heat treatment at 150 to 300° C. to obtain an insulating layer having satisfactory characteristics as an internal-layer material. The various characteristics are further improved by exposure to active energy rays such as ultraviolet rays after the development.

As a method for forming a conductor circuit on the adhesive layer formed of the adhesive between circuit layers and in the via holes, there can be utilized, for example, a subtractive process comprising forming a pattern mask by panel copper plating, and then forming a circuit by etching, or an additive process comprising forming a circuit by pattern copper plating on a substrate having a pattern resist (an adhesive for plating used in the present invention may be reused) formed thereon. Whichever method is adopted, the adhesive surface is preferably treated in order to improve the adhesion between the adhesive and a plating layer before the plating. For the surface treatment, a well-known method for treating a substrate for plating is adopted. For example, the surface is roughened by mechanical polishing or treatment with an oxidizing agent such as chromic acid or a permanganate. Specifically, as a method for roughening the surface, there can be utilized a method adopted in a well-known production process of a printed wiring board, such as a method comprising swelling the adhesive layer with an alkaline chemical solution at first to facilitate the penetration of an oxidizing agent such as a permanganate into the insulating layer, partly decomposing the insulating layer by oxidation with a permanganate solution, and then carrying out a neutralizing treatment with an acidic chemical solution. By this surface roughening procedure, a large number of fine anchors for improving the adhesion of a plating layer can be formed on the adhesive layer surface. For giving a catalyst for plating, there are adopted well-known methods such as a catalyst treatment using an acidic catalyst solution containing a mixture of palladium chloride and stannous chloride and an activating treatment with a catalyst-activating solution.

Furthermore, a multilayer printed wiring board comprising wiring layers and insulating layers, which are alternately formed, can be obtained by applying the photosensitive resin composition of the present invention on a wiring layer, or pressure-bonding a dry film of the photosensitive resin composition to a wiring layer, and repeating the process described above.

DESCRIPTION OF PREFERRED EMBODIMENTS

The present invention is concretely illustrated with the following examples, which should not be construed as limiting the scope of the invention. Hereinafter, parts are all by weight.

EXAMPLE 1

A composition was prepared by blending 100 parts of a methacrylic acid-modified bisphenol A novolak (phenolic hydroxyl equivalent 383, methacryl modification rate 50 mol %), 45 parts of N,N1-(4,4'-diphenylmethane)-bismaleimide (BMI-H, a trade name, mfd. by K•I CHEMICAL INDUSTRY Co., Ltd.), 8 parts of 2,2'-dimethoxy-2-phenylacetophenone (IRUGACURE 651, a trade name, mfd. by NIPPON CIBA-GEIGY Co., Ltd.), 30 parts of a polypropylene glycol diacrylate (NEOMER PA-305, a trade name, mfd. by SANYO CHEMICAL INDUSTRIE, Ltd.), 60 parts of N,N'-dimethylformamide, 0.5 part of triethylamine, 60 parts of barium sulfate and 1 part of a defoaming agent, and kneading them three times by means of a three-roll mill.

EXAMPLE 2

A composition was prepared in the same manner as in Example 1 except for using 50 parts of N,N'-(2,2'-diethyl-6,6'-dimethyl-4,4,-methylenediphenylene)-bismaleimide (BMI-70, a trade name, mfd. by K•I CHEMICAL INDUSTRY Co., Ltd.) in place of 45 parts of N,N'-(4,4'-diphenylmethane)bismaleimide, using 45 part of methyl ethyl ketone in place of 60 parts of N,N'-dimethylformamide, and changing the amount of the defoaming agent from 1 part to 2 parts.

Comparative Example 1

A composition was prepared in the same manner as in Example 1 except for using 45 parts of a cresol novolak type epoxy resin (EPICLON-N660, a trade name, mfd. by DAINIPPON INK & CHEMICALS, INC.) in place of 45 parts of N,N'-(4,4'-diphenylmethane)bismaleimide.

Comparative Example 2

A composition was prepared in the same manner as in Example 1 except for using 32 parts of a bisphenol A-based novolak in place of 100 parts of the methacrylic acid-modified bisphenol A-based novolak.

Comparative Example 3

A composition was prepared in the same manner as in Example 1 except for using 100 parts of a methacrylic acid-modified bisphenol A-based novolak (methacryl modification rate 100 mol %) in place of 100 parts of the methacrylic acid-modified bisphenol A-based novolak.

For evaluating characteristics of each of the compositions obtained above, as an adhesive between circuit layers and the insulating layer of a multilayer printed wiring board, samples for the evaluation were prepared as follows. Each composition was applied on a PET film to a thickness of 150 $\mu$m with a curtain coater and dried in a circulating hot air oven. In this case, each of the compositions of Example 1 and Comparative Examples 1 to 3 was dried at 125° C. for 15 minutes to obtain a dry film, and the composition of Example 2 was dried at 100° C. for 15 minutes to obtain a dry film.

Each of the thus obtained dry films was pressure-bonded to a copper-plated through-hole printed wiring board, covered with a photomask and then irradiated with ultraviolet rays in a dose of 300 mJ/cm$^2$ by means of an exposing apparatus manufactured by ORC MANUFACTURING Co., Ltd. Then, the unexposed portion was removed with a 1.5% aqueous sodium hydroxide solution for development to form via holes. The thus treated dry film was irradiated with ultraviolet rays in a dose of 300 mJ/cm$^2$ and then heat-cured at 220° C. for 60 minutes. Thereafter, panel copper plating was conducted in a thickness of 25 $\mu$m on the dry film as electroless copper plating to form a pattern mask, and then a circuit was formed by etching to obtain a multilayer printed wiring board.

Table 1 shows the evaluation results obtained for the compositions of Examples 1 and 2 and Comparative Examples 1 to 3. Methods for testing the characteristics shown in Table 1 and criteria for evaluating the characteristics are as follows.

Resistance to Soldering

Each sample was immersed in a soldering bath at 260° C. three times for 15 seconds each time according to the test method prescribed in JIS C6481. Each time the sample was immersed, the state and adhesion of the adhesive layer were synthetically evaluated.

○—No abnormality in the appearance of the coating film.

X—Blister, melting or peeling.

Glass Transition Temperature

A sheet-like cured product of each adhesive was prepared and its glass transition temperature was measured in a temperature range of ordinary temperature to 260° C. at a load of 5 g and a heating rate of 5° C./min by a thermal and mechanical analysis method (using SS-120C manufactured by SEIKO INSTRUMENT Co., Ltd.).

Resolution

Whether via holes had been formed in each printed wiring board obtained above by the use of the photomask having black spots with a diameter of 100 $\mu$m was judged by observation under a microscope.

○—Via holes could be formed.

X—Via holes could not be formed.

TABLE 1

| Test item | | Example 1 | Example 2 | Comparative Example 1 | Comparative Example 2 | Comparative Example 3 |
|---|---|---|---|---|---|---|
| Resistance to soldering | once | ○ | ○ | ○ | ○ | × |
|  | twice | ○ | ○ | ○ | ○ | × |
|  | 3 times | | | | | |
| Glass transition temperature | | 190° C. | 180° C. | 120° C. | 180° C. | 110° C. |
| Resolution | | ○ | ○ | ○ | × | × |
| Adhesion | | 100 | 100 | 100 | 100 | 15 |

EXAMPLE 3

A composition was prepared by blending 100 parts of a methacrylic acid-modified bisphenol A novolak (phenolic hydroxyl equivalent 383, methacryl modification rate 50 mol %), 55 parts of N,N'-(2,2'-diethyl-6,6'-dimethyl-4,4'-methylenediphenylene)bismaleimide (BMI-70, a trade name, mfd. by K•I CHEMICAL INDUSTRY Co., Ltd.; unsaturated imide group equivalent 221), 30 parts of a cresol novolak type epoxy resin (EPICLON N-690, a trade name, mfd. by DAINIPPON INK & CHEMICALS, INC.; epoxy equivalent 223), 8 parts of 2,2'-dimethoxy-2-phenylacetophenone (IRUGACURE 651, a trade name, mfd. by NIPPON CIBA-GEIGY Co., Ltd.), 30 parts of a polypropylene glycol diacrylate (NEOMER PA-305, a trade name, mfd. by SANYO CHEMICAL INDUSTIRIE, Ltd.), 150 parts of methyl ethyl ketone, 0.5 part of triethylamine, 60 parts of barium sulfate and 1 part of a defoaming agent, and kneading them three times by means of a three-roll mill.

EXAMPLE 4

A composition was prepared in the same manner as in Example 3 except for using 45 parts of N,N'-(4,4'-diphenylmethane)bismaleimide (BMI-H, a trade name, mfd. by K•I CHEMICAL INDUSTRY Co., Ltd.; unsaturated imide group equivalent 179) in place of 55 parts of N,N'-(2,2'-diethyl-6,6'-dimethyl-4,4'-methylenediphenylene) bismaleimide (BMI-70, a trade name, mfd. by K•I CHEMICAL INDUSTRY Co., Ltd.), and using 60 parts of N,N'-dimethylformamide in place of 150 parts of methyl ethyl ketone.

EXAMPLE 5

A composition was prepared in the same manner as in Example 3 except for using 18 parts of a bisphenol F-based epoxy resin (EPICLON N-830S, a trade name, mfd. by DAINIPPON INK & CHEMICALS, INC.; epoxy equivalent 178) in place of 30 parts of the cresol novolak type epoxy resin (EPICLON N-690, a trade name, mfd. by DAINIPPON INK & CHEMICALS, INC.).

Comparative Example 4

A composition was prepared in the same manner as in Example 3 except for changing the amount of N,N'-(2,2'-diethyl-6,6'-dimethyl-4,4'-methylenediphenylene)-bismaleimide (BMI-70, a trade name, mfd. by K•I CHEMICAL INDUSTRY Co., Ltd.) from 55 parts to 0 part, and changing the amount of the cresol novolak type epoxy resin (EPICLON N-690, a trade name, mfd. by DAINIPPON INK & CHEMICALS, INC.) from 30 parts to 85 parts.

Comparative Example 5

A composition was prepared in the same manner as in Example 3 except for changing the amount of N,N'-(2,2'-diethyl-6,6'-dimethyl-4,4'-methylenediphenylene)-bismaleimide (BMI-70, a trade name, mfd. by K•I CHEMICAL INDUSTRY Co., Ltd.) from 55 parts to 85 part, and changing the amount of the cresol novolak type epoxy resin (EPICLON N-690, a trade name, mfd. by DAINIPPON INK & CHEMICALS, INC.) from 30 parts to 0 part.

EXAMPLE 6

In a mortar, 116 parts (1 mol) of maleic acid powder and 198 parts (1 mol) of 4,4'-diaminodiphenylmethane powder were uniformly mixed to obtain a solid mixture of maleic acid and 4,4'-diaminodiphenylmethane. The mixture was heated at 130° C. for 1 hour in a dryer to obtain a maleimide type addition compound.

To 100 parts of the obtained maleimide type addition compound was added 230 parts of N,N'-dimethylformamide to prepare a solution of the maleimide type addition compound having a resin concentration of 30%.

The maleimide type addition compound solution was added to a methacrylic acid-modified bisphenol A novolak (phenolic hydroxyl equivalent 383, methacryloyl group modification rate 50 mol %) in an amount of 50 parts in terms of solids per 100 parts of the novolak. The resulting mixture was blended with 8 parts of 2,2'-dimethoxy-2-phenylacetophenone (IRUGACURE 651, a trade name, mfd. by NIPPON CIBA-GEIGY Co., Ltd.), 30 parts of a polypropylene glycol diacrylate (NEOMER PA-305, a trade name, mfd. by SANYO CHEMICAL INDUSTRIE, Ltd.), 50 parts of methyl ethyl ketone, 0.5 part of triethylamine, 60 parts of barium sulfate and 1 part of a defoaming agent, and they were kneaded three times by means of a three-roll mill to obtain a composition.

EXAMPLE 7

In 2-ethoxyethanol was previously dissolved 116 parts (1 mol) of maleic acid powder. Similarly, 198 parts (1 mol) of 4,4-diaminodiphenylmethane powder was dissolved in 2-ethoxyethanol. The solutions were uniformly stirred and mixed at room temperature for 24 hours to obtain a mixture of maleic acid and 4,4'-diaminodiphenylmethane. The product was separated from the mixture and then heated at 130° C. for 1 hour in a dryer to obtain a maleimide type addition compound.

From the obtained maleimide type addition compound, a maleimide type addition compound solution was prepared in the same manner as in Example 6. Using this solution, a composition was prepared in the same manner as in Example 6.

EXAMPLE 8

In a mortar, 174 parts (3 mols) of maleic acid powder and 100 parts (1 mol) of 4,4-diaminodiphenyl ether powder were uniformly mixed to obtain a solid mixture of maleic acid and 4,4-diaminodiphenyl ether. The mixture was heated at 120° C. for 2 hours in a dryer to obtain a maleimide type addition compound.

From the obtained maleimide type addition compound, a maleimide type addition compound solution was prepared in the same manner as in Example 6. Using this solution, a composition was prepared in the same manner as in Example 6.

Comparative Example 6

A composition was prepared in the same manner as in Example 6 except for using 50 parts of a bisphenol F-based epoxy resin (EPICLON 830S, a trade name, mfd. by DAINIPPON INK & CHEMICALS, INC.; epoxy equivalent 178) in place of 50 parts of the maleimide type addition compound used for preparing the composition in Example 6, and changing the amount of methyl ethyl ketone from 50 parts to 100 parts.

For evaluating characteristics of each of the compositions obtained in Examples 3 to 7 and Comparative Examples 4 to 6, as an adhesive between circuit layers and the insulating layer of a multilayer printed wiring board, samples for the evaluation were prepared in the same manner as above. Drying conditions in the preparation of a dry film were as follows: each of the compositions of Examples 4, 6, 7 and 8 was dried at 125° C. for 15 minutes, and each of the compositions of Examples 3 and 5 and Comparative Examples 4 to 6 was dried at 100° C. for 15 minutes.

The evaluation results are shown in Table 2 and Table 3. The peel strength was measured as follows. The adhesive layer surface of a copper-plated through-hole printed wiring board having as a pressure-bonded layer a layer of each adhesive obtained above was polished with sandpaper, washed and then subjected to surface roughening by treatment with an alkaline chemical solution (MACUDIZER9204, a trade name, mfd. by NIPPON MACDERMID Co., Ltd.) at 35° C. for 3 minutes, treatment with a permanganate solution (pure water; MACUDIZER9275, a trade name, mfd. by NIPPON MACDERMID Co., Ltd.: 50 g/L; MACUDIZER9276: 5 vol %) at 75° C. for 7 minutes, and then treatment with an acidic chemical solution (pure water; 98% concentrated sulfuric acid: 2 vol %; MACUDIZER, mfd. by NIPPON MACDERMID Co., Ltd.: 10 vol %) at 43° C. for 5 minutes. Subsequently, a copper layer of 35 μm in thickness was formed on the insulating layer by conducting electroless copper plating and then copper electroplating. Two notches were made at a distance of 1 cm from each other and the peel strength was measured.

TABLE 2

| Test item | Example 3 | Example 4 | Example 5 | Comparative Example 4 | Comparative Example 5 |
|---|---|---|---|---|---|
| Glass transition temperature | 170° C. | 176° C. | 155° C. | 134° C. | 182° C. |

TABLE 2-continued

| Test item | Example 3 | Example 4 | Example 5 | Comparative Example 4 | Comparative Example 5 |
|---|---|---|---|---|---|
| Peel strength | 860 N/m | 850 N/m | 950 N/m | 620 N/m | 370 N/m |
| Resolution | ○ | ○ | ○ | ○ | ○ |

TABLE 3

| Test item | Example 6 | Example 7 | Example 8 | Comparative Example 6 |
|---|---|---|---|---|
| Glass transition temperature | 172° C. | 175° C. | 168° C. | 124° C. |
| Peel strength | 860 N/m | 910 N/m | 810 N/m | 650 N/m |
| Resolution | ○ | ○ | ○ | ○ |

As can be seen from the above results, the photosensitive resin composition of the present invention is excellent in heat resistance and adhesion to a wiring layer and it permits development with a high resolution even when an aqueous developing solution containing no organic solvent is used. Therefore, said composition has characteristics required of an adhesive between circuit layers for an internal-layer material for a multilayer printed wiring board, is excellent in heat resistance, and makes it possible to produce a printed wiring board that permits high-density packaging and has a high reliability. That is, the production process of the present invention has the following advantages: the production process is excellent in productivity because it permits formation of a plurality of openings at a time; the diameter of the openings can be reduced because of the excellent resolution, so that impassable through-holes (IVH) can easily be formed, resulting in a high degree of freedom in design; and the number of layers in a printed wiring board can easily be increased by repeating the same process.

What is claimed is:

1. A photosensitive resin composition comprising a compound (A) having in the molecule at least one phenolic hydroxyl group and at least one acryloyl or methacryloyl group, an unsaturated imide compound (B) and a photopolymerization initiator (C) as essential constituents, and optionally an epoxy compound (D) having at least two epoxy groups in the molecule.

2. A photosensitive resin composition according to claim 2, wherein the compound (B) is a bismaleimide compound.

3. A composition according to claim 1, wherein per 100 parts by weight of the compound (A), the compound (B) is incorporated in a proportion of 10 to 900 parts.

4. A composition according to claim 1, wherein per 100 parts by weight of the compound (A), the compound (B) and the epoxy compound (D) are incorporated in a total proportion of 10 to 900 parts by weight, and the photopolymerization initiator (C) is incorporated in a proportion of 0.2 to 50 parts by weight, the equivalent ratio of the unsaturated imide groups of the unsaturated imide compound (B) to the epoxy groups of the epoxy compound (D) being 0.2 to 5.

* * * * *